United States Patent [19]

Sale et al.

[11] Patent Number: 4,465,511
[45] Date of Patent: Aug. 14, 1984

[54] MAKING NIOBIUM INTERMETALLIC COMPOUNDS

[75] Inventors: Frank R. Sale, Altrincham, England; Huseyin Yorucu, JE Alkmaar, Netherlands

[73] Assignee: National Research Development Corporation, London, England

[21] Appl. No.: 551,886

[22] Filed: Nov. 15, 1983

[30] Foreign Application Priority Data

Nov. 15, 1982 [GB] United Kingdom ................ 8232605
Feb. 14, 1983 [GB] United Kingdom ................ 8304014

[51] Int. Cl.³ ......................... B22F 9/22; C22C 27/02
[52] U.S. Cl. ..................................... 75/0.5 B; 29/599; 75/0.5 BB; 75/84; 75/84.4; 75/84.5; 420/425; 420/490
[58] Field of Search ................ 75/0.5 B, 0.5 BB, 84, 75/84.4, 84.5; 148/11.5 P; 420/425, 552, 555, 556, 557, 590; 29/599

[56] References Cited

U.S. PATENT DOCUMENTS

| | | | |
|---|---|---|---|
| 3,290,186 | 12/1966 | Rosi et al. | 148/11.5 P |
| 4,005,990 | 2/1977 | Newkirk et al. | 420/425 |
| 4,050,147 | 9/1977 | Winter | 75/0.5 BB |
| 4,054,686 | 10/1977 | Newkirk et al. | 420/425 |
| 4,202,931 | 5/1980 | Newkirk et al. | 420/425 |
| 4,402,768 | 9/1983 | Newkirk et al. | 148/11.5 P |

Primary Examiner—W. Stallard
Attorney, Agent, or Firm—Oblon, Fisher, Spivak, McClelland & Maier

[57] ABSTRACT $NbSn_2$ is made by passing $NbCl_5$ volatilized in an argon stream at 550° C. to liquid tin. The product precipitates as a solid, while the tin chloride by product is carried away by the argon. $Nb_6Sn_5$ is made from this $NbSn_2$ by reacting it with more niobium halide vapor. $NbSn_2$ or $Nb_6Sn_5$ are useful intermediates in making the A15-structure superconductor $Nb_3Sn$.

7 Claims, No Drawings

MAKING NIOBIUM INTERMETALLIC COMPOUNDS

This invention relates to a method of making the niobium intermetallic compounds $NbA_x$ where A is tin (Sn), germanium (Ge), aluminum (Al) or gallium (Ga) or any mixture thereof and x exceeds $\frac{1}{3}$, for example $NbSn_2$, $Nb_6Sn_5$ or $NbGa_3$.

$NbA_x$ is useful as an intermediate in the manufacture of A15-structure superconductors of formula $Nb_3A$, by powder processing routes to $Nb_3A$ which involve the diffusion reaction of niobium with an intermetallic compound $NbA_x$. The most widely used A15 superconductor is at present $Nb_3Sn$ although much work is in progress to study other niobium intermetallic compounds involving one or more of the metallic elements outlined above, for example $Nb_3Al_{0.76}Ge_{0.24}$. Because the final A15 intermetallic compounds are so brittle they cannot be mechanically shaped to produce the required finished superconducting component such as a magnet winding, but have to be made from precursors which can be shaped, the precursors being shaped as required and then reacted to form the superconductors.

U.K. patent specification 1,473,341 describes a method of making $V_3Ga$ superconductor from $V_2Ga_5$ intermediate, and $Nb_3Sn$ can be made, directly analogously, from $NbSn_2$ by what is now referred to as the ECN process, described by C.A.M. van Beijnen and J. D. Elen in IEEE Transactions on Magnetics, Vol Mag-15, p. 87 (1979). In summary, a hollow niobium tube (the 'precursor') may be packed with $NbSn_2$ powder (the 'intermediate'), shaped as required, and diffusion-annealed to form effectively a $Nb_3Sn$ superconducting component; a proportion of copper may be present with the $NbSn_2$ powder as an activator for diffusion-annealing. These observations are included here for information only and do not form any part themselves of the present invention.

According to the present invention, a method of making the intermetallic compound $NbA_y$, where A is Sn, Ge, Al, Ga or any mixture thereof and y exceeds $\frac{1}{3}$ and has the highest available value, comprises contacting niobium halide vapour (where the halogen is preferably chlorine and the halide is preferably the pentahalide) with liquid A at a temperature above the melting point of A and at which the niobium halide is volatile but below the dissociation temperature of $NbA_y$. In this method, a product $NbA_y$ precipitates as a solid, while the by-product, a halide of A, is usually volatile. (This $NbA_y$ is the intermetallic compound which contains the maximum amount of A in the system under consideration.) Thus the method preferably further comprises conveying the niobium halide vapour in a stream of unreactive gas (such as argon) which serves also to carry away the by-product. By thus removing the by-product, further purification steps for the $NbA_y$ (such as leaching) are obviated. The reaction with the niobium halide may be continued until all traces of the liquid A are removed. Further reaction of this $NbA_y$ with the niobium halide may be allowed in order to produce other intermetallic compounds $NbA_z$ richer in niobium, e.g. $Nb_6Sn_5$, if so desired. The symbol z exceeds $\frac{1}{3}$ but is less than y. Here, an unreactive gas (such as argon) may again serve to carry away the by-product, again obviating further purification steps.

$NbA_x$ (i.e. both $NbA_y$ and $NbA_z$) made by this method has a distinctive morphology and also has the feature that no free A is present.

The product $NbA_y$ is important for the subsequent conversion to $Nb_3A$. Taking the example of A = Sn, this first product is $NbSn_2$ which is a line compound having no significant compositional variation from the stoichiometric ratio of Nb to Sn of 1:2. Any deficiency of niobium from the stoichiometric requirement leaves elemental tin which would melt at 232° C., well below any reasonable diffusion annealing temperature, and interfere with the formation of the desired $Nb_3Sn$. The presence of excess tin also causes difficulties in the shaping of the material to produce wire for magnet manufacture, particularly if a warm extrusion process is used in the first stages of mechanical shaping. Any niobium in excess of the stoichiometric requirement forms $Nb_6Sn_5$.

The invention will now be described by way of example.

EXAMPLE 1

Niobium pentachloride powder was fed from a vibratory feeder to a heated tube gently swept by a current of hot inert gas (argon) all at 550° C. The niobium pentachloride was vaporised and conveyed by the gas stream to a pool of liquid tin, also at 550° C. The vapour reacted with the liquid tin according to the reaction

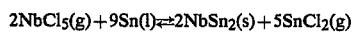

$$2NbCl_5(g) + 9Sn(l) \rightleftharpoons 2NbSn_2(s) + 5SnCl_2(g)$$

The stannous chloride $SnCl_2$ was volatile at this temperature and hence was carried away by the gas stream while the $NbSn_2$, the desired product (stable up to 930° C.), was the sole solid in the reaction. The reaction was continued until all the liquid tin had been consumed thus leaving pure $NbSn_2$ as the reaction residue.

EXAMPLE 2

In a completely analogous way to Example 1, niobium pentachloride was reacted with liquid gallium at a temperature of 550° C. to produce the intermetallic compound $NbGa_3$ according to the reaction

$$NbCl_5(g) + 8Ga(l) \rightleftharpoons NbGa_3(s) + 5GaCl(g)$$

Again the supply of niobium pentachloride was maintained until all the liquid gallium had been consumed. Hence pure $NbGa_3$ was obtained as the reaction residue, the gallium monochloride produced as the other reaction product being volatile at the temperature of reaction.

EXAMPLE 3

Example 1 was repeated and further reaction at 550° C. was allowed between the Example 1 product and further argon-borne niobium halide, thus forming the intermetallic compound $Nb_6Sn_5$. The stannous chloride $SnCl_2$ by-product (volatile at this temperature) was, as in Example 1, carried away by the gas stream.

We claim:

1. A method of making the intermetallic compound $NbA_y$, where A is any one of Sn, Ge, Al, Ga including mixtures thereof and y exceeds $\frac{1}{3}$ and has the highest available value, comprising contacting niobium halide vapour with liquid A at a temperature above the melting point of A and at which the niobium halide is volatile but below the dissociation temperature of $NbA_y$, whereby a product $NbA_y$ precipitates as a solid.

2. A method according to claim 1, wherein the niobium halide is niobium chloride.

3. A method according to claim 1, wherein the niobium halide is niobium pentahalide.

4. A method according to claim 1, further comprising conveying the niobium halide vapour in a stream of unreactive gas, which serves also to carry away halide of A, the by-product of the reaction.

5. A method according to claim 1, wherein the reaction with the niobium halide vapour is continued until all the liquid A is consumed.

6. A method of making an intermetallic compound $NbA_z$, where z exceeds $\frac{1}{3}$ but is less than y, comprising making the intermetallic compound $NbA_y$ by the method of claim 1 and reacting the $NbA_y$ with niobium halide vapour to form $NbA_z$.

7. A method according to claim 6, wherein the niobium halide vapour for reacting with the $NbA_y$ is conveyed in a stream of unreactive gas, which serves also to carry away halide of A, the by-product of the reaction.

* * * * *